United States Patent
Lo Hine Tong et al.

(10) Patent No.: US 8,847,703 B2
(45) Date of Patent: Sep. 30, 2014

(54) FILTERING NETWORK IN HR-SI SILICON TECHNOLOGY

(75) Inventors: Dominique Lo Hine Tong, Rennes (FR); Raafat Lababidi, Tok-Tripoli (LB); François Baron, Thorigne-Fouillard (FR); Ali Louzir, Rennes (FR); Bernard Jarry, Chaleix (FR); Bruno Barelaud, Isle (FR); Julien Lintignat, Limoges (FR)

(73) Assignee: Thomson Licensing (FR)

( * ) Notice: Subject to any disclaimer, the term of this patent is extended or adjusted under 35 U.S.C. 154(b) by 509 days.

(21) Appl. No.: 13/138,367

(22) PCT Filed: Feb. 12, 2010

(86) PCT No.: PCT/FR2010/050244
§ 371 (c)(1),
(2), (4) Date: Sep. 23, 2011

(87) PCT Pub. No.: WO2010/092308
PCT Pub. Date: Aug. 19, 2010

(65) Prior Publication Data
US 2012/0028576 A1    Feb. 2, 2012

(30) Foreign Application Priority Data

Feb. 12, 2009 (FR) ..................................... 09 50904

(51) Int. Cl.
*H03H 7/01* (2006.01)
*H03H 7/075* (2006.01)
*H03H 1/00* (2006.01)

(52) U.S. Cl.
CPC ..... *H03H 7/0115* (2013.01); *H03H 2001/0064* (2013.01); *H03H 2001/0078* (2013.01); *H03H 7/075* (2013.01); *H03H 7/1758* (2013.01); *H03H 7/1733* (2013.01)

USPC .......................................... 333/175; 333/185

(58) Field of Classification Search
CPC ................ H03H 7/0015; H03H 7/075; H03H 2001/0085; H01P 1/2056
USPC ......................................... 333/175, 185, 202
See application file for complete search history.

(56) References Cited

U.S. PATENT DOCUMENTS

2007/0126529 A1    6/2007 Chen

FOREIGN PATENT DOCUMENTS

| EP | 0998036 | 5/2000 |
|---|---|---|
| JP | 06268406 | 9/1994 |
| JP | 2003152157 | 5/2003 |
| JP | 2005198241 | 7/2005 |
| WO | WO2008065009 | 6/2008 |

OTHER PUBLICATIONS

Lababidi et al., "High Resistive Silicon Based Low-Pass Active Filter Design for TV on Mobile Application", Microwave Symposium Digest, 2009, MTT '09, Jun. 7, 2009, pp. 1053-1056.
Search Report Dated Aug. 4, 2010.

*Primary Examiner* — Benny Lee
*Assistant Examiner* — Jorge Salazar, Jr.
(74) *Attorney, Agent, or Firm* — Jack Schwartz and Associates, PLLC

(57) ABSTRACT

The invention relates to a filtering network in HR-Si silicon technology defined by at least one cut-off frequency and comprising an input terminal for receiving the signal to be filtered and an output terminal for delivering a filtered signal. The network comprises a first ground line connected by its ends to first and second ground points connected directly to the ground plane, a second ground line connected via its ends to third and fourth ground points directly connected to the ground plane, a plurality of L/C resonant elements connected in parallel and linked via one end to one of the two ground lines and via the other end between them, by means of coupling inductors which thus create transmission zeros. Each ground line forming inductive elements via inductances the network comprises capacitive elements in series with at least some of said inductive elements, the value of the capacitive elements being selected so that the resonant frequency of the inductive and capacitive elements in series corresponds to a frequency lying outside of the bandwidth.

3 Claims, 9 Drawing Sheets

FILTERING NETWORK IN HR-SI SILICON TECHNOLOGY

This application claims the benefit, under 35 U.S.C. §365 of International Application PCT/FR2010/050244, filed Feb. 12, 2010, which was published in accordance with PCT Article 21(2) on Aug. 19, 2010 in French and which claims the benefit of French patent application No. 0950904, filed Feb. 12, 2009.

TECHNICAL FIELD

The present invention relates to the implementation of a filtering network in a technology such as HR-Si (High Resistance Silicon) technology. It concerns particularly multi-standard terminals applying for example, to the GSM and UMTS standards for mobile telephony and to DVB-HT standards for TV reception.

BACKGROUND ART

An example of such a filtering network is a basic low-pass filter of pseudo-elliptical type, having 11 poles and five transmission zeros. Such a network is able to allow the DVB-T signal situated in the band [462-862] MHz to pass and to reject the GSM transmission band found in the band [890-915] MHz.

A filtering network of this type is described in FIG. 1. The network is symmetrical. Consequently, the symmetrical rank elements have the same values. The network comprises:

coupling inductances L1 to L6 of values Ls1, Ls2, Ls3, connected in series between an input port P1 and an output port P2.

L/C series resonant elements of values Lr1/Cr1, Lr2/Cr2, Lr3/Cr3 connected in parallel between the connection points A1 to A5 of coupling inductances L1 to L6 and the ground.

Between the connection point A1 of inductances L1 and L2 and the ground is thus connected a first resonant element Lr1/Cr1. Between the point A2 and the ground is thus connected a second resonant element Lr2/Cr2, and between the point A3 and the ground is thus connected a third resonant element Lr3/Cr3. Symmetrically between the point A4 and the ground is connected a resonant element Lr2/Cr2, and between the point A5 and the ground is thus connected a resonant element Lr1/Cr1. These "L/C series" elements create transmission zeros in the immediate neighbourhood of the cut-off frequency to increase the selectivity of the filter.

However according to a typical embodiment, to produce a filter discreet L/C components are used that are transferred onto a low-cost substrate, of FR4 type, the lower side of this substrate serving as a ground plane, and the grounding of these components being made by means of metallised holes.

It is known to those skilled in the art that the grounding of RF elements is never perfect and that this imperfection can be modelled to the first order by a parasite inductance. Concerning the grounding via metallised holes, the value of this inductance will depend notably on the diameter of holes and their depth. These ground parasite inductances can noticeably degrade the performances of a function, in which case it is necessary to take account and to compensate for them by re-optimizing the design. Thus, in the case of the filtering network of FIG. 1, the minimisation of ground parasite inductances is obtained by directly connecting the L/C series resonant elements to the lower ground plane of the circuit via metallised holes.

The HR-Si technology is today widely used for the integration of passive functions such as self-inductances, the capacities and resistances enable complete functions to be designed, such as for example filters, baluns, mixers and impedance transformers, with noticeable performances at the level of cost. It also enables the integration of systems on a technology known as SIP (System-In-Package), in which case the HR-Si technology serves not only to integrate RLC elements but also serves as support and interface to diverse integrated circuits constituting the system.

These performances are made possible due to the use of a high resistance silicon (HR-Si) typically of 1000Ω.cm. A structure of this type comprises a first layer of substrate HR-Si, typically of a thickness of 300 µm and a permittivity of the order of 11.7, metallised on one side, corresponding to the lower side. Above the other side corresponding to the upper side, two layers of metallic conductors are superimposed. Between the first metallic layer and the second upper layer is located an insulating layer, for example based on SiO2. This structure enables MIM (Metal-Isolation-Metal) capacities and coil inductances on the second upper layer to be implemented. The two layers are connected due to metallised crossings. On the upper side of the second metallic layer is located a passivation layer, for example, a layer of organic polymer BCB (benzocyclobutene).

However current technology does not enable metallised crossings to be produced between the first metallic layer and the lower side of the HR silicon constituting a ground plane. It thus does not enable the LC elements to be connected directly, that is to say by the shortest route, to the ground.

This limitation poses design problems in the particular case of complex functions, for example a high order filter comprising multiple elements to be grounded, as the parasite elements are such that they can completely degrade and denature the ideal response to the filter without there being a means of overcoming it.

FIG. 2 shows a cross-section of an embodiment of a passive filter in high resistance silicon in HR-Si technology, according to the prior art as described above and FIG. 3 shows the electric schema of such a low-pass filter. This standard filter comprises between the input and output ports P1 and P2, L/C series components represented by the capacities Cr1, Cr2, Cr3 and inductances Lr1, Lr2, Lr3 and inserted in parallel between the coupling inductors of values Ls1, Ls2, Ls3 and parasite ground lines M1, M2. The parasite ground lines M1, M2 between the ground points Gr1, Gr2 and Gr3, Gr4 respectively were modelled by the inductances Lm1, Lm2, Lm3, Lm4.

The response in transmission from this filter represented in FIG. 4 thus shows not only a shift of the cut-off frequency but also of transmission zeros. The attenuation beyond the cut-off frequency is on the other hand a lot lower comparatively with that of the ideal filter. The set of these degradations are due to the presence of these ground parasite inductances.

In the case of a measurement test points are used. These points are posed on the circuit as shown in FIG. 2, the central core on the input or output line, and the associated ground points at the ends of the ground lines.

The resonant elements Lr1/Cr1, Lr2/Cr2 and in particular Lr3/Cr3 can thus no longer be adjusted to the shortest ground points. These parasite ground lines Lm1, Lm2, Lm3, Lm4, of non-negligible length, as shown in FIG. 2 thus heavily modify the response of the filter, and are difficult to compensate for.

The present invention thus addresses the problem of grounding of constituent elements of this function when designed in HR-Si technology or any other technology that doe not enable vertical ground crosses to be produced.

Different solutions known in the prior art are proposed to resolve this problem.

A typical solution is to transfer this circuit in HR-Si technology onto the ground plane of a transfer substrate, and to connect in several points the parasite ground lines to this plane. This solution is illustrated by the circuit represented in FIG. 5 that show numerous wires, known as ground wires, connecting the ground lines to the ground plane enabling the effects of ground parasite inductances to be limited.

The circuit in HR-Si technology can also be mounted in flip-chip mode, this circuit being then returned on to the transfer circuit and connected to this latter using balls. Numerous balls are also necessary here to ensure a correct grounding of the filter.

Another solution known to the prior art is to design the filters in differential mode. This solution consists in transforming a filter referenced to the ground into a circuit in differential mode. The differential filter results in this case from a duplication of the non-differential filter according to a symmetry axis constituted by the global ground line. An example is provided in the thesis by M. L. GRIMA "Conception d'un récepteur radiofréquence en technologie intégrée pour les systémes de radioastronomie du futur" (Design of a radio-frequency receiver in integrated technology for future radio-astronomy systems), December 2007, Université d'Orléans.

It is clear that this solution presents a major disadvantage that is the doubling of components and from that of the silicon surface. Moreover it requires the use of transformers to convert the signals from differential mode into non-differential mode.

DISCLOSURE OF INVENTION

The invention proposes another solution to this problem:

It consists in a filtering network in silicon technology defined by at least one cut-off frequency and comprising:
an input terminal to receive the signal to be filtered and an output terminal to provide a filtered signal,
a first ground line connected by its ends to a first and a second ground point,
a second ground line connected by its ends to a third and a fourth point,
a plurality of coupling inductances connected in series between the input terminal and the output terminal.

A plurality of LC resonant elements connected in parallel, being connected by one end to one of two ground lines and by the other end together via the intermediary of coupling inductances thus creating transmission zeros.

The ground lines comprises inductive elements, the network comprises capacitive elements in series with at least some of said inductive elements, the value of capacitive elements being selected such that the resonance frequency of said inductive and capacitive elements in series corresponds to a frequency situated outside of the bandwidth.

Preferentially, the capacitive elements are capacities connected to the ground lines.

According to a variant of the invention the LC resonant circuits can be connected indifferently to one or other of the ground lines and the capacitive elements are adapted to the values of ground lines forming inductive elements.

Preferentially, the filtering network is produced in HR-Si silicon technology. The invention has the advantage of providing a network able to eliminated the harmful effects of ground lines and enables, as a consequence, a response of an ideal filter to be conserved.

A filter network according to the invention only has four ground points, enabling as a consequence an inter-connection to the other simplified functions as well as a reduction in the cost of assembly and integration.

The location of ground lines is reduced, thus liberating room on the HR-Si circuit for the integration of other functions.

The invention makes possible the direct test of filters on "wafer" using a sensor, and the verification of performances with respect to the final size of the filter.

The cost and the size of the circuit according to the invention are noticeably reduced.

BRIEF DESCRIPTION OF THE DRAWINGS

The characteristics and advantages of the aforementioned invention, as well as others, will emerge more clearly upon reading the following description made with reference to the drawings attached, wherein.

To simplify the description, the same references will be used in these latter figures to designate the elements fulfilling identical functions.

DETAILED DESCRIPTION OF PREFERRED EMBODIMENTS

The idea of the invention is thus to compensate for the harmful effects of ground lines by introducing capacities that will enter into resonance with these lines, making them thus transparent from an electrical point of view. For the same purpose, another way to ground the resonators of a silicon circuit is also proposed The new filtering network proposed as well as the associated silicon circuit are described in detail hereafter. The simulated performances are likewise indicated as proof of the concept.

Figure 6:
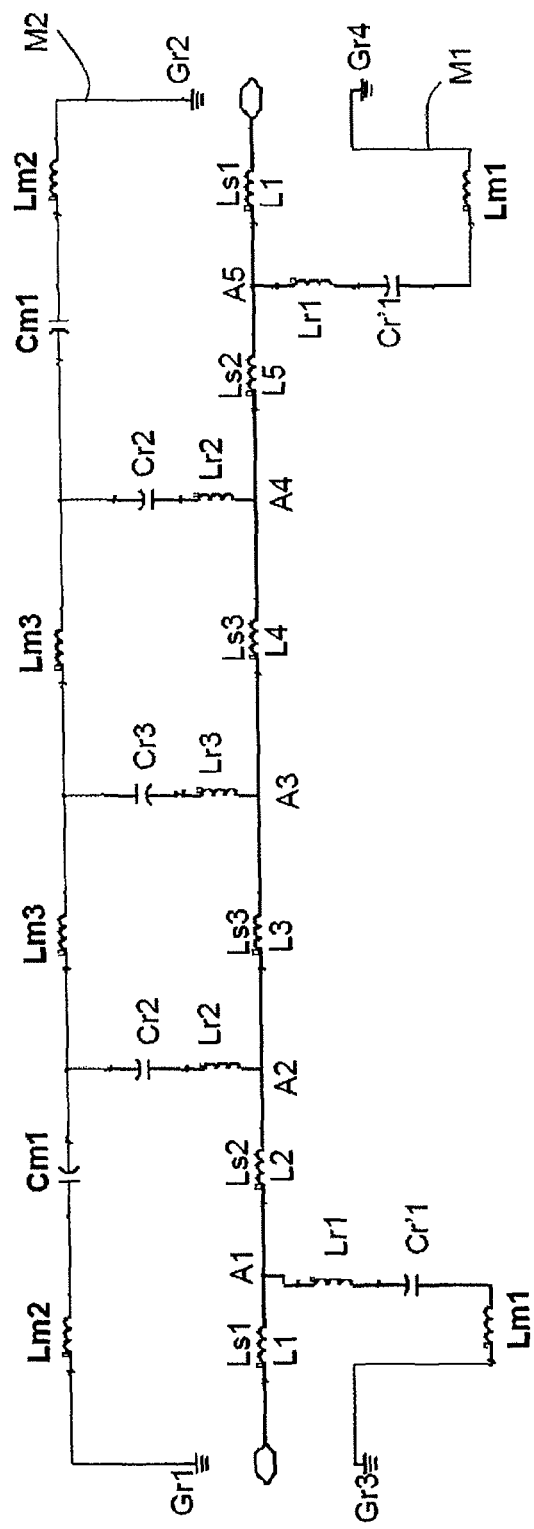
FIG. 6 shows a network of a low-pass filter according to the invention.

FIG. 6 shows a low-pass filter network to the order of 11 according to the invention.

It concerns the low-pass filter previously described but the principle of the invention applies to all other filters or passive circuits designed on a silicon circuit.

Figure 1:
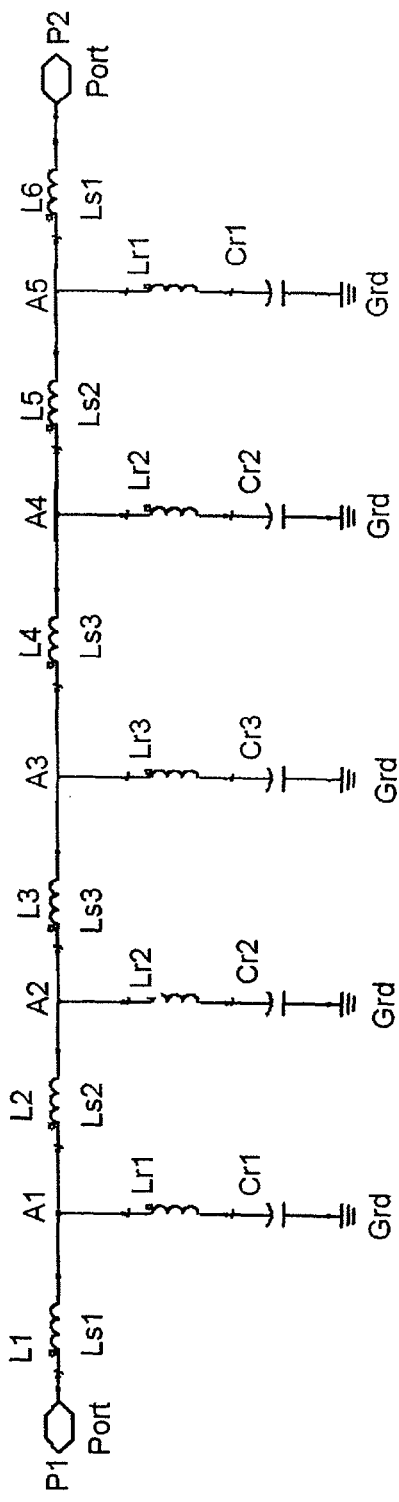
FIG. 1 already described, shows a pseudo-elliptical low-pass filter with 11 poles.
Figure 3:
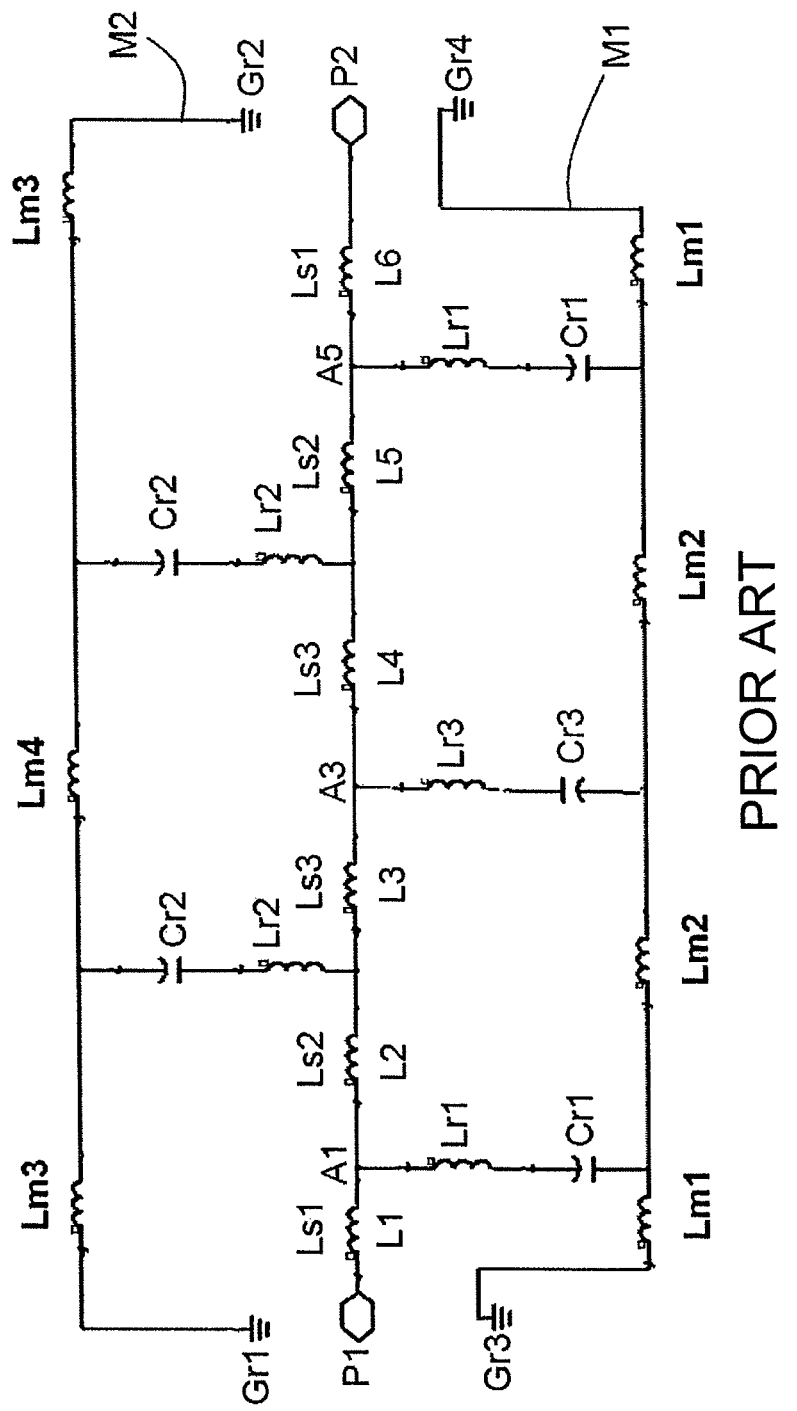
FIG. 3 shows a low-pass filter network including the ground parasite inductances.

This filter is symmetric and the symmetrical rank elements have the same values. It comprises, like the filter described with FIG. 1, coupling inductances L1 to L6 connected in series between an input port P1 and an output port P2 as well as "LC series" resonant elements applied between the connection points A1 to A5 of coupling inductances and the ground lines M1 and M2. It is noted however, that with respect to the network of FIG. 3, the resonant element Lr3/Cr3 is now connected to the same ground line and the two resonant elements L2/Cr2. This arrangement enables the ground parasite inductance value to be reduced.

A first ground line M1 is connected to two ground points Gr1, Gr2 that are connected to the ground plane by the intermediary of the ground wire. Likewise a second ground line M2 is connected to two ground points Gr3, Gr4 that are connected to the ground plane by the intermediary of the ground wire. The ground line sections form parasite inductive elements represented by the inductances Lm1, Lm2, Lm3.

According to the invention, a capacity Cm1 was introduced in series with each of the parasite inductances Lm2 that return to the ground all the elements of the filter. The value of this capacity is calculated in a way so that it resonates with Lm2 at a frequency situated as close as possible to the GSM band to be rejected. For example, and as an indication, with the values of the following inductive and capacitive elements:

Coupling inductances: Ls1=2.7 nH, Ls2=10 nH, Ls3=9.1 nH L/C series elements: Lr1=12 nH, Lr2=7.5 nH, Lr3=7.5 nH Cr'1=2.1 pF, Cr2=3.4 pF, Cr3=3.5 pF and presuming a parasite inductance Lm2 of 1 nH, Cm1 is fixed at 25 pF in a way to have a resonance at 1.01 GHz. Thus at this frequency, which is critical for the selectivity of the filter, the equivalent impedance of Lm2 in series with Cm1 is null, and the input/output grounds are returned to the ends of the resonators Lr2/Cr2. The harmful effects of line Lm2 are thus eliminated.

According to a variant of the invention, a capacity in series was introduced with each of the parasite inductances Lm1 that returns to the ground these elements of the filter. The value of this capacity is integrated with that of the capacity Cr1 of the first resonator and the capacity of the first element is replaced by this equivalent Cr'1. For example presuming a parasite inductance Lm1 of 0.3 nH, a value for Cr'1 of 2.1 pF is acceptable.

It may be noted that, advantageously the $3^{rd}$ resonator Lr3/Cr3 is connected to the same ground line M2 as the 2 resonators Lr2/Cr2. This disposition also enables the ground parasite inductance value Lm3 to be compensated by the capacity Cm1. For example the network is balanced to have a resonance at 1.01 GHz with an equivalent parasite inductance Lm3 of 0.5 nH.

The invention consists then in introducing a capacity Cm1 connected to the corresponding ground point and in series with the parasite inductance Lm2 that return the set of these elements to the ground.

A variant of the invention consists in re-optimising the values of Lr3/Cr3, by taking account of the value of two inductances Lm3, so that the resonator resonates at the frequency desired initially.

Figure 7:
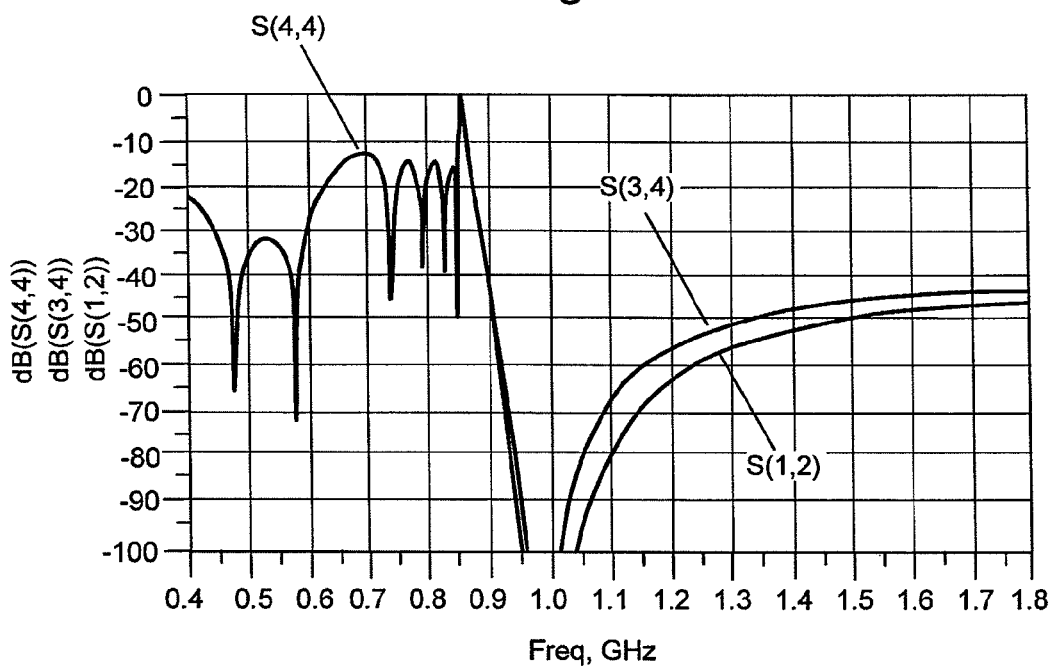
FIG. 7 shows the response in transmission dB (S(3,4)) and in reflection dB (S(4,4)) of the filter of FIG. 6 in comparison with the response in transmission of the ideal filter.
Figure 5:
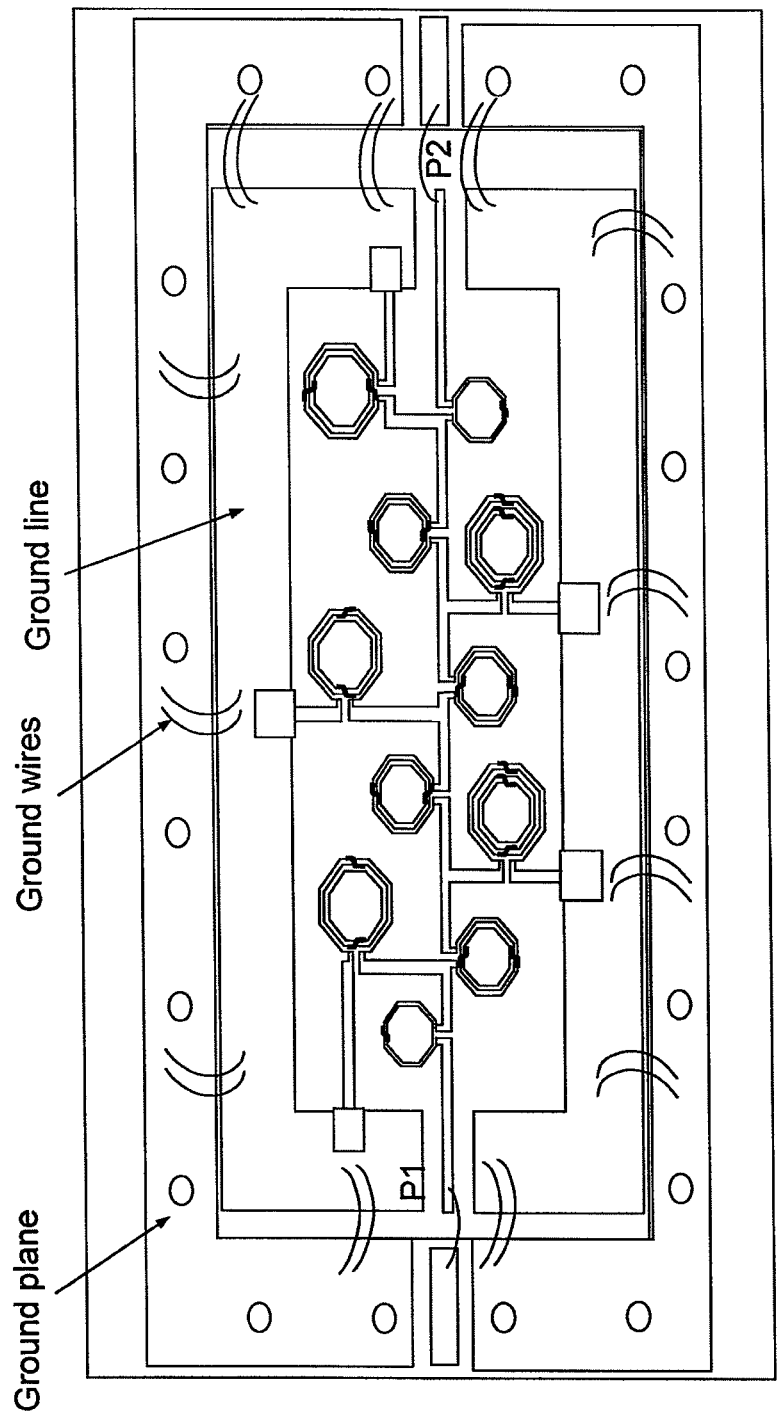
FIG. 5 shows a top view of an embodiment of a filter in HR-Si high resistance silicon technology including the ground wires.

As shown in FIG. 7, it can be seen that the response in transmission compared with that of the ideal solution, shows that the new network succeeds well in neutralising the effects of parasite ground lines. The response in reflection shows moreover that the filter remains well adapted.

Figure 2:
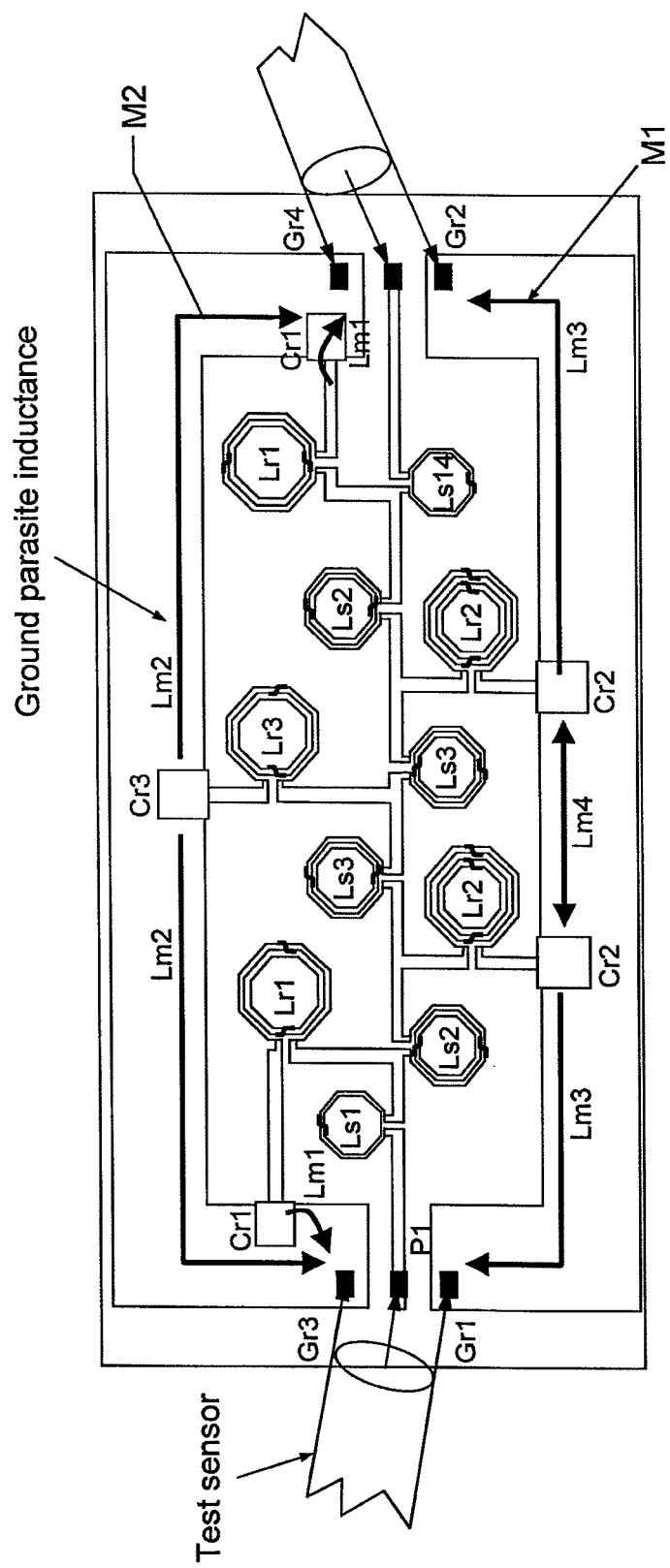
FIG. 2 shows a top view of an embodiment of a filter in HR-Si high resistance silicon technology.
Figure 4:
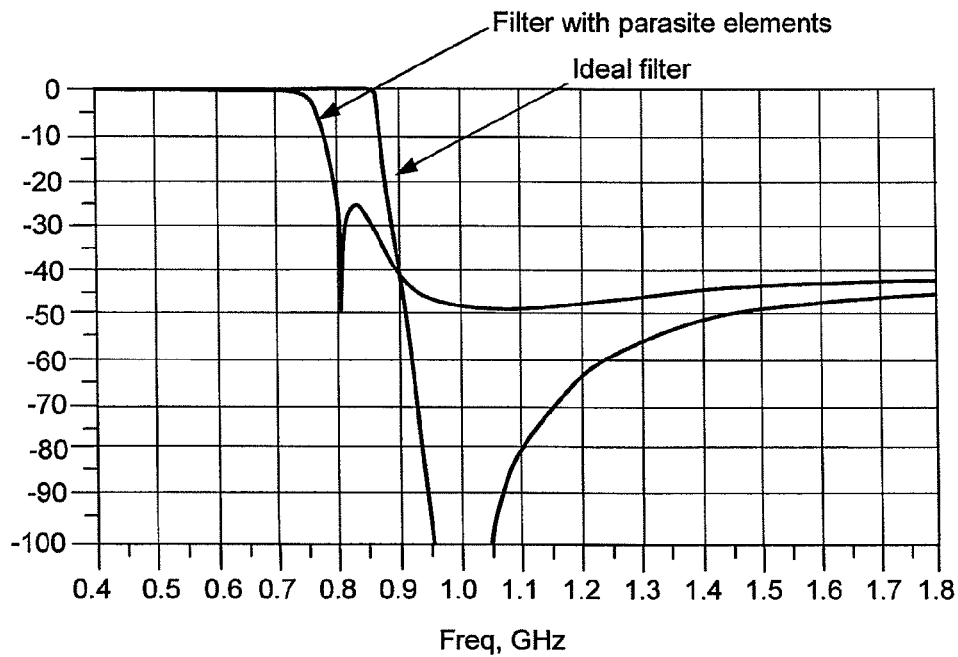
FIG. 4 shows the response in transmission of a filter with ground parasite inductances compared with that of an ideal filter.
Figure 8:
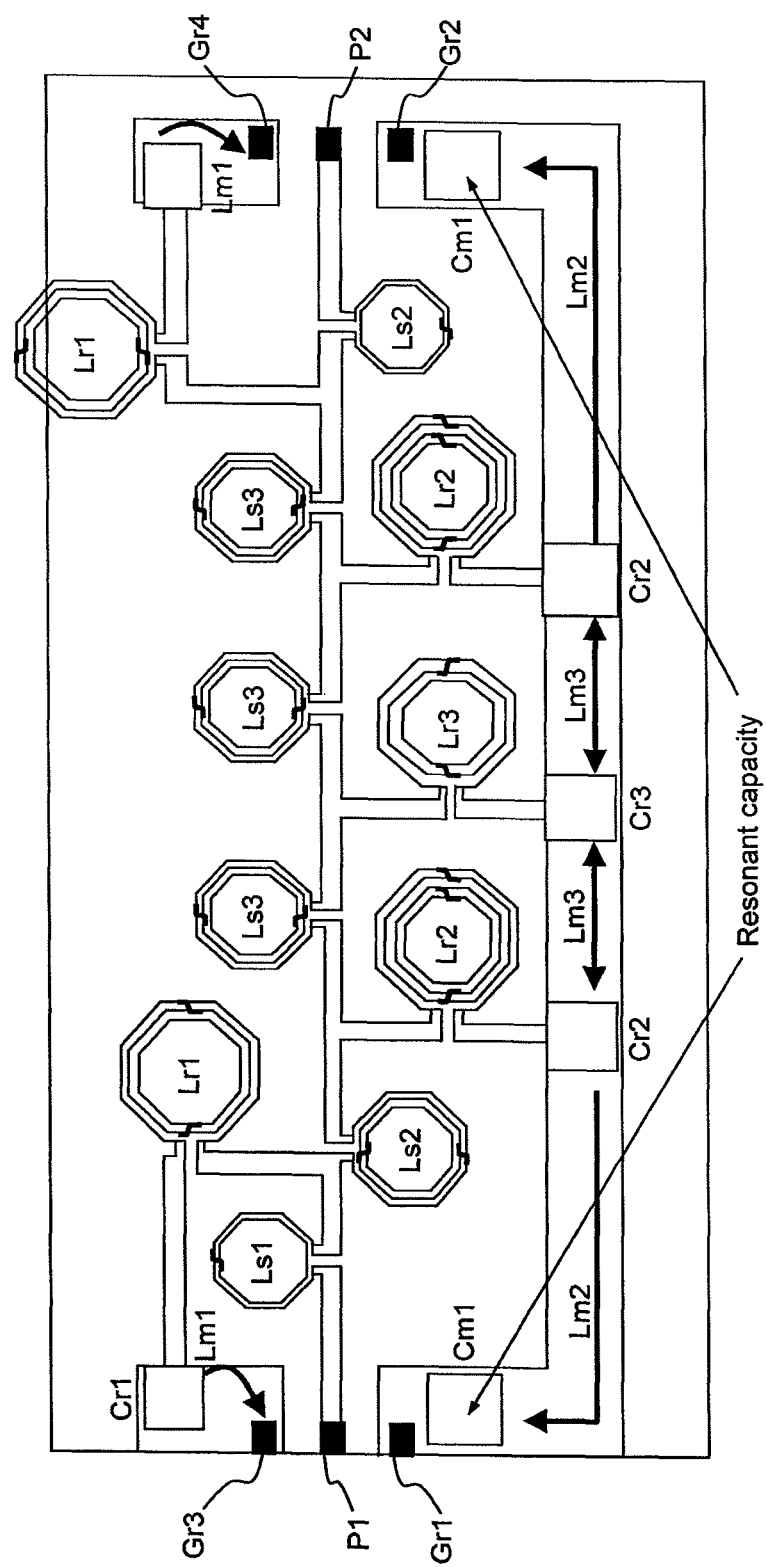
FIG. 8 shows a top view of a filter embodiment according to the invention in HR-Si high resistance silicon.
Figure 9:
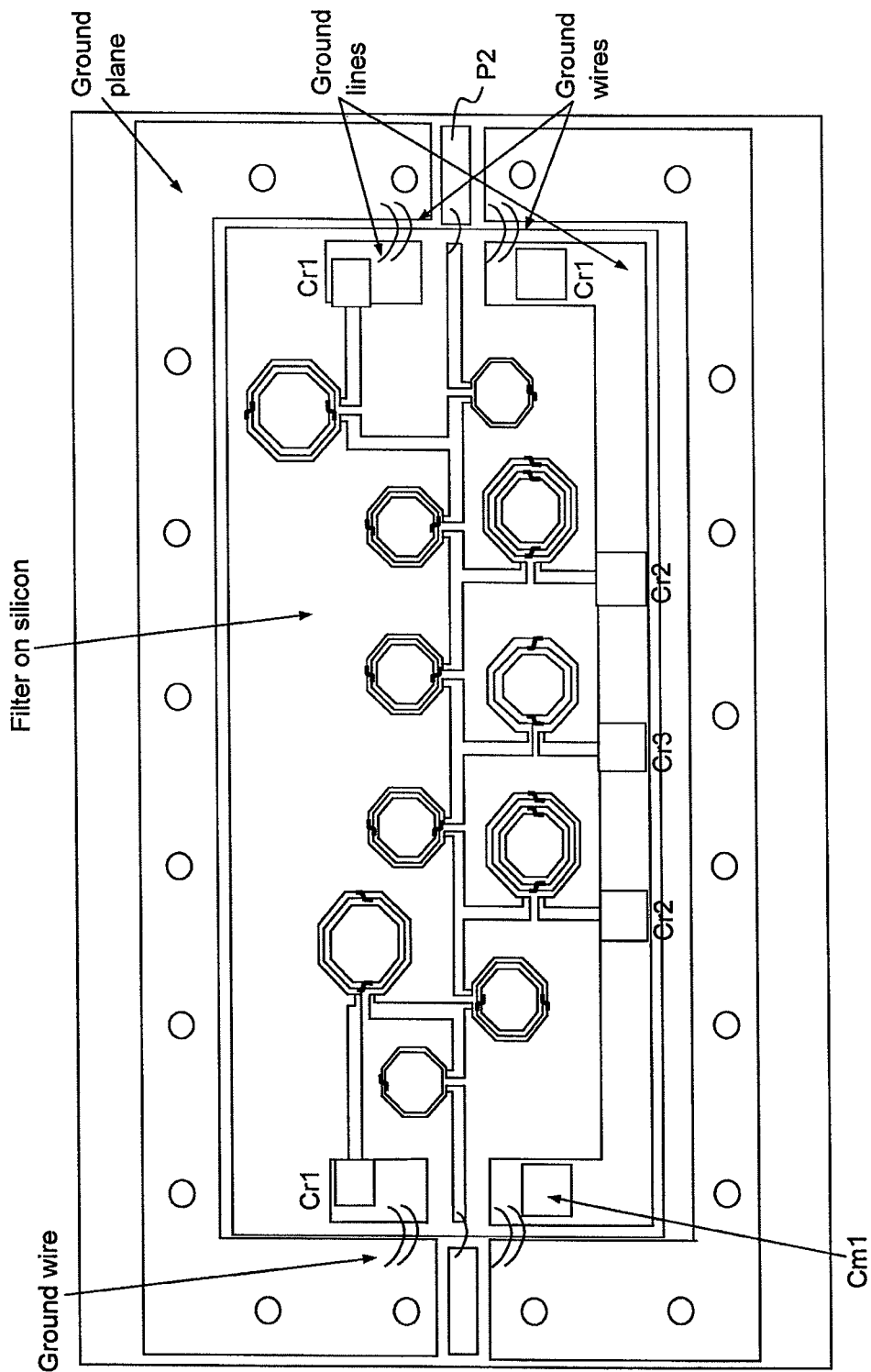
FIG. 9 shows a top view of an embodiment of filters according to the invention in HR-Si high resistance silicon technology including the ground wires.

FIGS. 8 and 9 show a possible design of the circuit in HR-Si silicon. In FIG. 8 and in comparison with FIG. 2, the capacities Cm1 and Cm2 are added to the extremity of Lm2 value ground parasite inductances and in connection with the ground points Gr1, Gr2. In series with the ground parasite inductances Lm1 are connected the equivalent capacities Cr'1. The Lm3 value ground parasite inductances are shown in connection with the capacity Cr3 of the third resonator and each of the two capacities Cr2 respectively forming the second resonator. Other designs of this circuit can be considered for which the ground parasite inductances will be compensated by capacitive elements. It may be noted on FIG. 8 that the filter only requires the connections via ground wires from the four ground points Gr1, Gr2, Gr3 and Gr4 to the ground plane, namely two at the input access and two at the output access, instead of a multitude required by a usual solution represented by FIG. 4.

Figure 10:
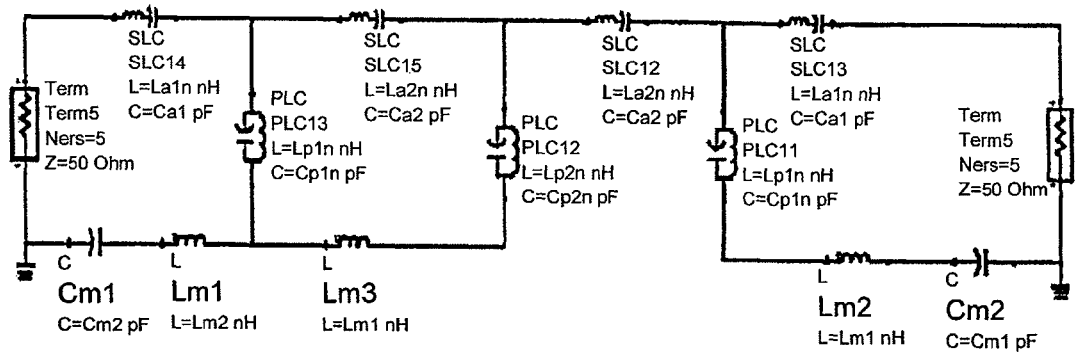
FIG. 10 shows a second embodiment according to the present invention of a low-pass filter of the $7^{th}$ order.
Figure 11:
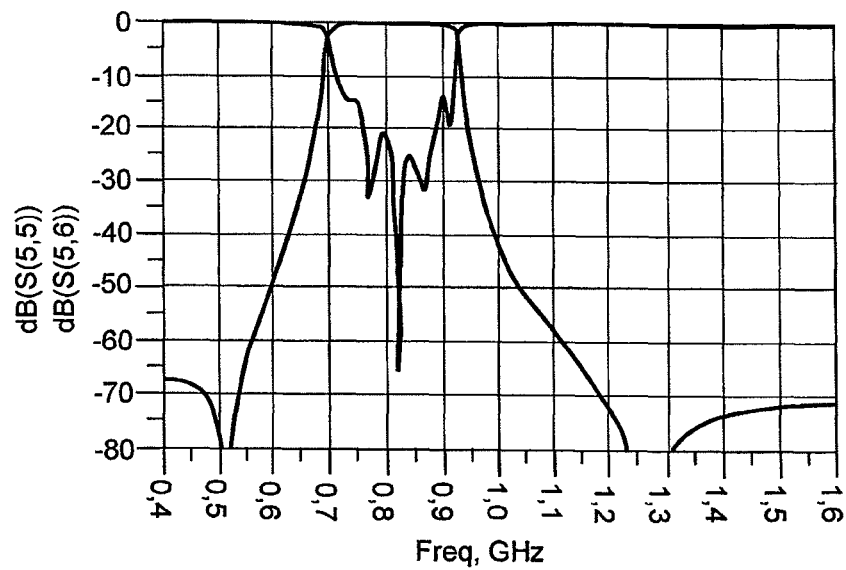
FIG. 11 shows the response of the filter of FIG. 10.

A second embodiment of the present invention is shown in FIGS. 10 and 11. FIG. 10 shows a low-pass filter of the order of 7 comprising coupling elements Ls1, Cs1, Ls2, Cs2 connected in series between an input port Term1 and an output port Term2. The resonant elements parallel to the value Lp1/Cp1, Lp2/Cp2 are connected in parallel between the connection points of coupling elements of ground lines. As mentioned above, the ground lines form parasite inductive elements represented by the inductances Lm1, Lm2, Lm3. In accordance with the present invention, a capacity Cm1 is connected in series with the inductive element Lm1 (and Cm2 respectively to Lm2) to return the set of elements to ground. The value of capacities Cm1 and Cm2 is calculated so that each capacity resonates with the ground series inductance to which it is connected at a frequency situated closest to the frequency to be rejected. Lm3 of a low value here compared with Lm1 and Lm2, will only have a small incidence on the response of the filter.

The responses in transmission and reflection obtained with the filter of FIG. 10 are represented in FIG. 11. The response in transmission clearly shows the transmission zeros created in one part and another of the bandwidth due to the addition of 2 capacities Cm1 and Cm2. Here is demonstrated then the compensation of harmful effects of ground lines due to the addition of capacities. This enables not only very low insertion losses to be kept in the bandwidth of the filter but also enables an increased frequency selectivity to be obtained.

The invention claimed is:

1. Filtering network in HR-Si silicon technology defined by at least one cut-off frequency and comprising: an input terminal to receive the signal to be filtered and an output terminal to provide a filtered signal, a first ground line is connected by its ends to first and second ground points, a second ground line is connected via its ends to third and fourth ground points, a plurality of L/C resonant elements are connected in parallel and being linked via one end to one of the two ground lines and via the other end, between them, by means of coupling inductors thus creating transmission zeros, wherein each ground line comprises inductive elements the network comprises capacitive elements in series with at least some of said inductive elements, the value of capacitive elements being selected so that the resonant frequency of inductive and capacitive elements in series corresponds to a frequency lying outside of the bandwidth.

2. Filtering network according to claim 1, wherein the capacitive elements, are capacitors connected to the ground points.

3. Filtering network according to claim 1, wherein the capacitive element is integrated with the resonant element, modifying the capacity value of the resonant element.

* * * * *